United States Patent [19]
Kaneda

[11] Patent Number: 5,287,759
[45] Date of Patent: Feb. 22, 1994

[54] METHOD AND APPARATUS OF MEASURING STATE OF IC LEAD FRAME

[75] Inventor: Noriaki Kaneda, Tokyo, Japan

[73] Assignee: Adtec Engineering Co., Ltd., Tokyo, Japan

[21] Appl. No.: 909,971

[22] Filed: Jul. 7, 1992

[30] Foreign Application Priority Data

Aug. 29, 1991 [JP] Japan .................................. 3-244468

[51] Int. Cl.$^5$ .............................................. G01B 11/14
[52] U.S. Cl. ................................... 73/865.8; 356/375
[58] Field of Search .......................... 73/865.8, 865.9; 33/530, 533; 356/375, 376, 387; 358/107

[56] References Cited

U.S. PATENT DOCUMENTS

| | | | |
|---|---|---|---|
| 4,754,555 | 7/1988 | Stillman | 33/533 |
| 4,774,768 | 10/1988 | Chiponis | 33/533 |
| 5,168,217 | 12/1992 | Sakaguchi | 358/107 |

FOREIGN PATENT DOCUMENTS

| | | | |
|---|---|---|---|
| 0413349 | 2/1991 | European Pat. Off. | 358/107 |
| 0031909 | 2/1986 | Japan | 356/376 |
| 0246609 | 11/1986 | Japan | 356/376 |
| 0265442 | 11/1988 | Japan | 356/376 |
| 0074437 | 3/1989 | Japan | 356/375 |
| 0277708 | 11/1989 | Japan | 356/376 |
| 0136707 | 5/1990 | Japan | 356/376 |
| 0136708 | 5/1990 | Japan | 356/376 |
| 0010104 | 1/1991 | Japan | 356/375 |

*Primary Examiner*—Robert Raevis
*Attorney, Agent, or Firm*—Nields & Lemack

[57] ABSTRACT

A method and an apparatus of measuring a state of an IC lead frame are disclosed. The method has the steps of detecting a first projective position of an upper edge of a lead terminal of the IC lead frame on a reference surface and a second projective position of the upper edge, the second projective position of the upper edge having a projective angle different from that of the first projective position of the upper edge, detecting a first projective position of a lower edge of the lead terminal on the reference surface and a second projective position of the lower edge, the second projective position of the lower edge having a projective angle different from that of the first projective position of the lower edge, and computing the state of the lead terminal from the detections of the projective positions. The apparatus has a sensor transmitting beams of light at least at two different angles so as to sense an edge of a lead terminal of the IC lead frame at the angles, a mechanism moving the sensor along the IC lead frame transversely to the longitudinal axis of the lead terminal, a detector for a position of the sensor, and a computer computing a state of the lead terminal from an edge detection by the sensor and a detection of the position of the sensor by the position detector.

5 Claims, 4 Drawing Sheets

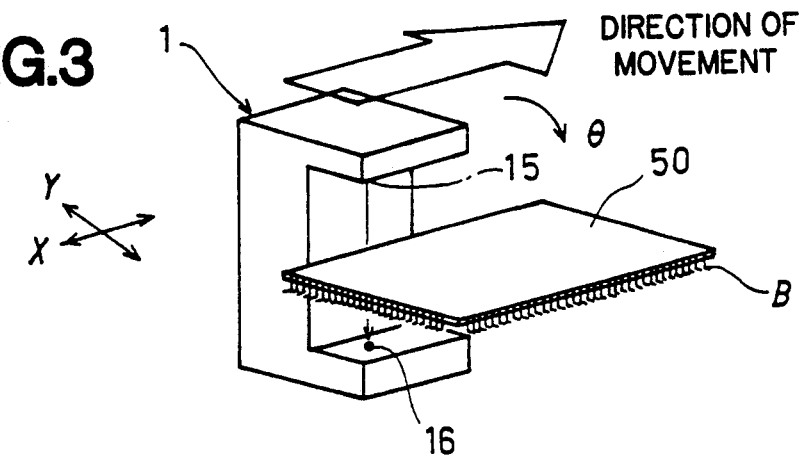
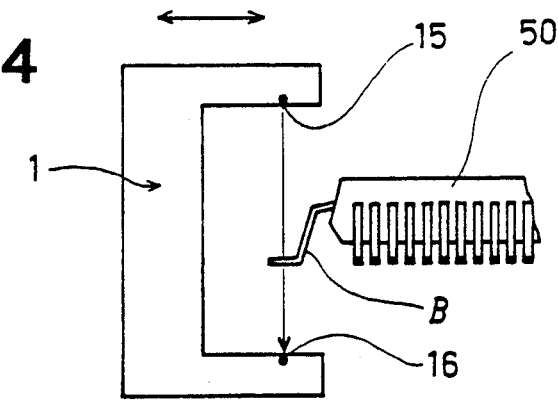
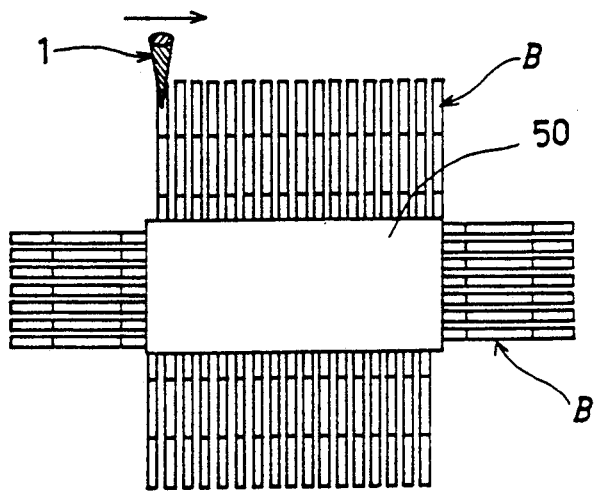

DIRECTION OF MOVEMENT

METHOD AND APPARATUS OF MEASURING STATE OF IC LEAD FRAME

BACKGROUND OF THE INVENTION

1. Field of the Invention

The present invention relates to a method and an apparatus of measuring a state of an IC lead frame.

2. Description of the Related Art

Recently, ICs have been used widely in various fields. A lead frame of an IC comprises many lead terminals in the form of thin strip. Inserting the lead terminals into a socket or directly into a printed circuit board connects the IC with a circuit connected to the socket or a circuit on the printed circuit board. All of the lead terminals must be horizontally arranged at a predetermined pitch and vertically even with one another. However, since the lead terminals often have an irregularity in the horizontal pitch and a vertical irregularity or a relief, the irregularities must be checked before the IC is actually mounted.

Heretofore, a measurement of a state of an IC lead frame employs a prior-art method of monitoring a reflected light from the lead frame using a CCD or ITV camera, and a prior-art method of monitoring a reflected light from the lead frame using laser beam. However, since the prior-art methods of measuring the state of the IC lead frame separately measures pitches and reliefs of the lead terminals, an apparatus of measuring the state of the IC lead frame is complicated and the measurement of the pitches and the reliefs of the lead terminals is time-consuming.

SUMMARY OF THE INVENTION

Therefore, an object of the present invention is to provide a novel method and apparatus of easily measuring pitches and reliefs of the lead terminals of an IC lead frame. A method of measuring a state of an IC lead frame according to the present invention comprises the steps of detecting a first projective position of an upper edge of a lead terminal of the IC lead frame on a reference surface and a second projective position of said upper edge on the reference surface, the second projective position of said upper edge having a projective angle different from a projective angle of the first projective position of said upper edge, detecting a first projective position of a lower edge of the lead terminal on the reference surface and a second projective position of said lower edge, the second projective position of said lower edge having a projective angle different from a projective angle of the first projective position of said lower edge, and computing the state of the lead terminal from the detections of said projective positions.

A combination of detection data of the four projective positions involves data of pitches of the lead terminals. A combination of the detection data of the four projective positions and data of the projective angles involves data of reliefs in the lead terminals. The state of the lead frame is computed from the above data.

An apparatus of measuring a state of an IC lead frame according to the present invention comprises a sensor transmitting beams of light at least at two different angles so as to sense an edge of a lead terminal of the IC lead frame at the two angles, means for moving said sensor along the IC lead frame transversely to the longitudinal axis of the lead terminal, means for detecting a position of said sensor, and means for computing a state of the lead terminal from an edge detection by said sensor and a detection of the position of said sensor by said position detecting means.

BRIEF DESCRIPTION OF THE DRAWINGS

FIG. 3 is a perspective view of an arrangement of an IC and a positional sensor unit arranged in normal position to the IC, illustrating a movement of the sensor unit transversely to the lead terminals of the IC;

FIG. 4 is a side elevation of the arrangement of FIG. 3, illustrating a movement of the sensor unit along the longitudinal axes of the lead terminals of the IC;

FIG. 5 is a plan view of the arrangement of FIG. 3, illustrating the movement of the sensor unit transversely to the lead terminals of the IC.

DESCRIPTION OF THE PREFERRED EMBODIMENTS

Preferred embodiments of the present invention will be described with reference to the drawings hereinafter.

Figure 1:
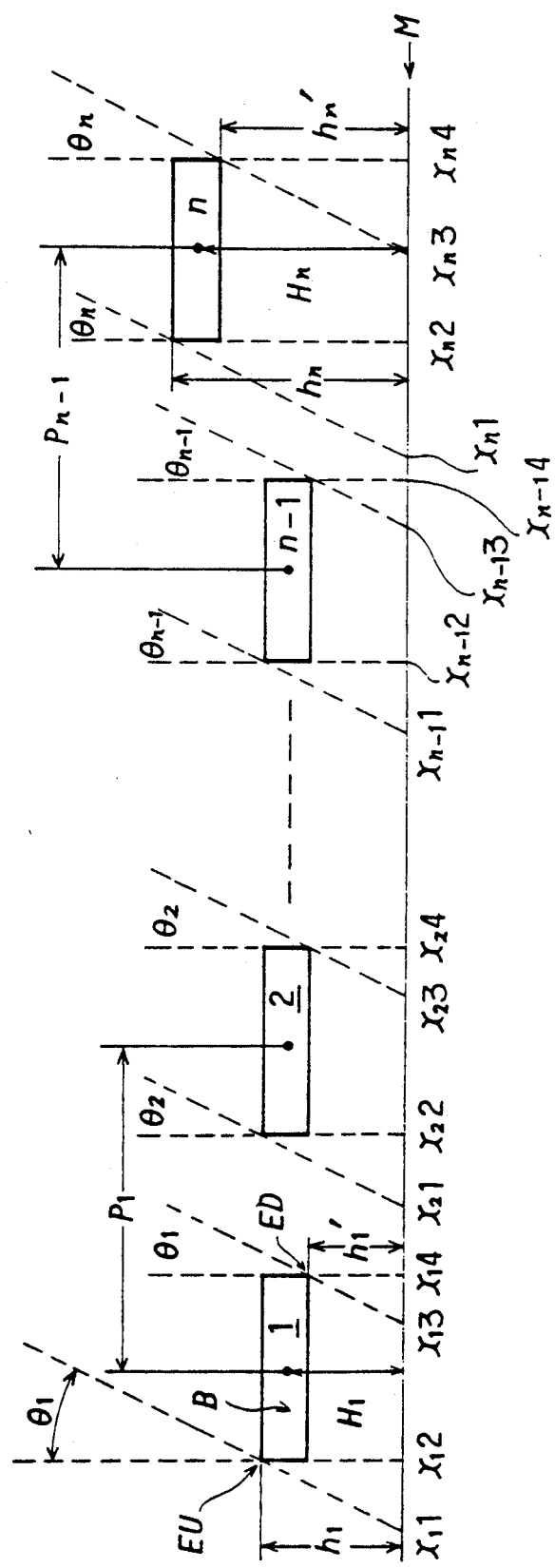
FIG. 1 is a schematic diagram illustrating a method of measuring a state of an IC lead frame according to an embodiment of the present invention.

FIG. 1 is a schematic diagram illustrating a method of measuring a state of an IC lead frame according to an embodiment of the present invention. FIGS. 2-6 show configurations and operations of an apparatus of measuring the state of the IC lead frame according to an embodiment of the present invention. As shown in FIGS. 3-6, a rectangular IC 50 has a lead frame B attached to its sides. The apparatus of measuring the state of the IC lead frame measures horizontal pitches of the lead terminals of the lead frame B as shown in FIG. 5 and vertical positions or heights of the lead terminals as shown in FIG. 4 to detect irregularities in the horizontal pitches and irregularities in the vertical positions or reliefs of the lead terminals.

The lead terminals of the lead frame B are generally horizontally arranged. The measuring apparatus twice detects the upper edge $E_U$ of a side of each of the lead terminals and the lower edge $E_D$ an opposite side of the lead terminal at different angles to measure the state of the lead frame B. That is, the measuring apparatus detects a projective position $x_12$ at which an image of the upper edge $E_U$ is projected at right angles on the reference surface M and a projective position $x_11$ at which an image of the upper edge $E_U$ of the lead terminal is obliquely projected at a predetermined angle $\theta_1$ on the reference surface M. The measuring apparatus also detects a projective position $x_14$ for the lower edge $E_D$ of the lead terminals as it does the projective position $x_12$ and a projective position $x_13$ for the lower edge $E_D$ of the lead terminal as it does the projective position $x_11$. In particular, the measuring apparatus employs a movable positional sensor detecting the upper edges $E_U$ of the lead terminals at their projective positions on the reference surface and lower edges $E_D$ of the lead terminals at their projective positions on the reference surface. Horizontal positions of the positional sensor at which it detects the upper edges $E_U$ and the lower edges $E_D$ of the lead terminals constitute projective positions of the edges $E_U$ and $E_D$ corresponding to the projective positions of the edges $E_U$ and $E_D$ on the reference surface M. The height $h_1$ of the upper edge $E_U$ of the lead terminal from the reference surface M and the height $h_1'$ of the lower edge $E_D$ of the lead terminal from the reference surface M are given by $$\tan \theta_1 = \frac{x_1 2 - x_1 1}{h_1} \quad (1)$$

and $$\tan \theta_1 = \frac{x_1 4 - x_1 3}{h_1'} \quad (2)$$

Since the height $H_1$ of the center of the lead terminal from the reference surface M is a half of the total of the height $h_1$ and the height $h_1'$, the height $H_1$ is given by $$H_1 = \frac{h_1 + h_1'}{2} = \frac{1}{2} \cdot \frac{x_1 2 - x_1 1 + x_1 4 - x_1 3}{\tan \theta_1} \quad (3)$$

When the height H of the center of each lead terminal is equal, the lead frame B has no relief and is normal. On the other hand, when the height $H_n$ of the center of the lead terminal is abnormal, the lead terminal is vertically displaced and has a relief.

A pitch $P_1$ of the lead terminals is given by $$P_1 = \frac{x_2 4 + x_2 2}{2} - \frac{x_1 4 + x_1 2}{2} \quad (4)$$

Generally, the height $H_n$ of the center of the lead terminal is given by $$H_n = \frac{1}{2} \cdot \frac{x_n 2 - x_n 1 + x_n 4 - x_n 3}{\tan \theta_n} \quad (5)$$

, wherein the angle $\theta_n$ is actually equal for each lead terminal.

Generally, a pitch $P_{n-1}$ of the led terminals is given by $$P_{n-1} = \frac{x_n 4 + x_n 2}{2} - \frac{x_{n-1} 4 + x_{n-1} 2}{2} \quad (6)$$

In the above embodiment of the measuring method of the present invention, actual horizontal positions of the movable positional sensor may constitute projective positions of the upper edges $E_U$ and the lower edges $E_D$ of the lead terminals. Therefore, the reference surface M is virtual and the horizontal position of the positional sensor constitutes an actual reference surface for measuring the height H of each lead terminal.

Figure 2:
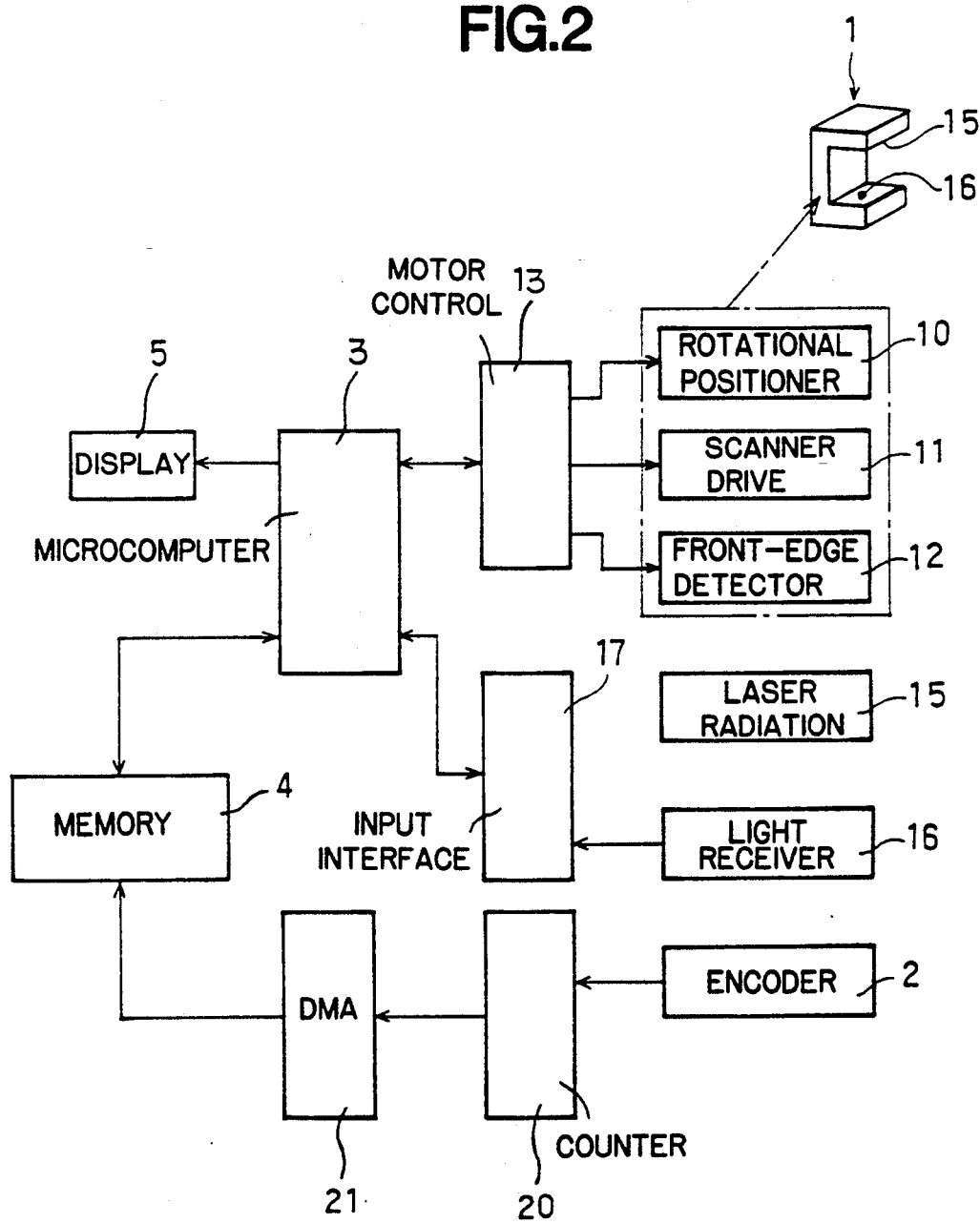
FIG. 2 is a block diagram of an apparatus of measuring the state of the IC lead frame according to an embodiment of the present invention.
Figure 6:
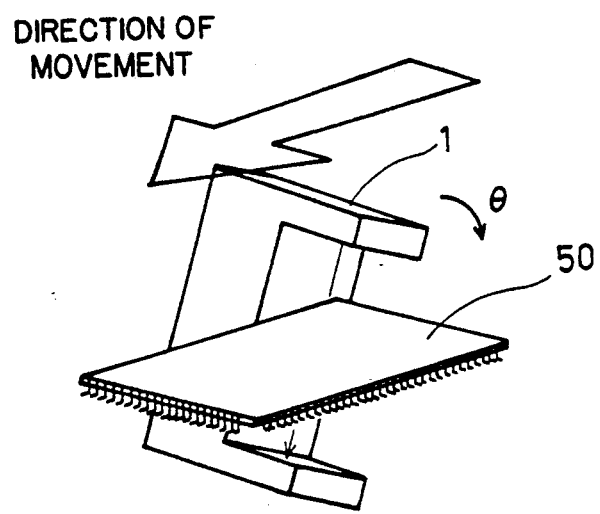
FIG. 6 is a perspective view of an arrangement of the IC and the position sensor unit arranged in an oblique position to the IC, illustrating a movement of the sensor unit transversely to the lead terminals of the IC.

The measuring apparatus will be described hereinafter. As shown in FIGS. 3 and 4, a positional sensor unit 1 which is yoke-shaped has an upper tongue provided above an IC 50 and a lower tongue provided below the IC 50. The upper tongue of the positional sensor unit 1 has a laser beam transmitter 15 and the lower tongue of the positioner sensor unit 1 has a laser beam receiver 16 opposite to the laser beam transmitter 15. As seen in FIGS. 2 and 6, a rotational positioner 10 can rotate the positional sensor unit 1 through a predetermined angle $\theta$ from a normal to the upper surface of the IC 50. A scanner drive 11 moves the positional sensor unit 1 along a side of the IC 50 in the direction of X-axis as shown in FIG. 3 so that the positional sensor unit 1 detects the upper and lower edges $E_U$ and $E_D$ each lead terminal. Since the scanner drive 11 moves the positional sensor unit 1 only in the direction of the X-axis in scanning the lead terminals, two pairs of corresponding positional sensor units 1 each opposite to one of the four sides of the IC lead frame B concurrently scan all of the lead terminals. Alternatively, a support table (not shown) may horizontally rotate the IC 50 so that the positional sensor unit 1 can scan all of the lead terminals attached to the sides of the IC 50. Alternatively, the positional sensor unit 1 may move along all of the sides of the IC 50. A front-edge detector 12 detecting the front edge of the lead frame B moves the positional sensor unit 1 towards the body of the IC 50 in the direction of Y-axis as shown in FIG. 3 so that the positional sensor unit 1 detects the upper and lower edges $E_U$ and $E_D$ of each lead terminal at an intermediate position on the lead terminal having a predetermined distance from the front edge of the lead terminal. A microcomputer 3 instructs a motor control 13 to control the scanner drive 11 and the front-edge detector 12. The laser beam receiver 16 receives laser beam from the laser beam transmitter 15 and produces signals which are applied to the microcomputer 3 through an input interface 17.

An encoder 2 encodes positions of the positional sensor unit 1 scanning the lead terminals of the IC 50 and produces corresponding positional signals which are applied to a counter 20 outputs of which are stored in a memory 4 by a direct memory access (DMA) 21. The microcomputer 3 computes by the mathematical equations (1) through (6) and displays results of computations on a display 5 which may be a CRT or printer.

In operation, the measuring apparatus moves the front-edge detector 12 towards the IC 50 in the direction of Y-axis to detect the front edge of the lead frame B and then moves the positional sensor unit 1 to the body of the IC 50 through the predetermined distance so as to align the beam path between the laser beam transmitter 15 and the laser beam receiver 16 with the intermediate point on a lead terminal, as shown in FIG. 4. Thus, the positional sensor unit 1 copes with irregular lengths of the lead terminals. In detail, since lead terminals of the IC 50 usually have irregular lengths, the positional sensor unit 1 cannot detect the front edges of all of the lead terminals if the positional sensor unit 1 scans transversely to the lead terminals above and below the front edges of them. The measuring apparatus comprises the front-edge detector 12 in order to ensure t hat the positional sensor unit 1 can surely detect the intermediate point of the side edges of all of the lead terminals. The measuring apparatus then controls the rotational positioner 10 to position the positional sensor unit 1 in normal to the upper and lower surfaces of the body of the IC 50. As shown in FIG. 5, the scanner drive 11 moves the positional sensor unit 1 along a side of the IC 50 transversely to the lead terminals to sequentially scan them. As shown in FIG. 1, the laser beam transmitter 15 transmits laser beam vertically to the lead terminals. The upper edge $E_U$ of each lead terminal intercepts the laser beam and on the other hand, at the lower edge $E_D$ the laser beam is allowed to pass. The positional sensor unit 1 produces corresponding signals which are applied to the microcomputer 3 through the input interface 17. The encoder 2 then detects the position of the positional sensor unit 1 and sends corresponding pulse signals to the counter 20. The counter 20 counts the pulse signals to provide the positional signal of the positional sensor unit 1 which is stored in the memory 4 by the DMA 21. That is, the memory 4 firsts stores values of the projective position $x_1 2$ of the upper edge $E_U$ of the lead terminal and the projective position $x_1 4$ of the lower edge $E_D$ of the lead terminal. The positional sensor unit 1 sequentially scans the lead terminal to detect a projective position $x_2 2$ of the upper edge $E_U$ of the lead terminal and a projective position $x_2 4$ of the lower edge $E_D$ of the lead terminal to a projective position $x_n 2$ of the upper edge $E_U$ of the lead terminal and a projective position $x_n 4$ of the lower edge $E_D$ of the lead terminal and the memory 4 sequentially stores values of the projective position $x_2 2$, $x_2 4$, - - - $x_n 2$ and $x_n 4$. Thus, the positional sensor unit 1 completes scanning the lead terminals as shown in FIG. 5.

The microcomputer 3, as shown in FIG. 6, then instructs the rotational positioner 10 to incline the positional sensor unit 1 through the angle $\theta$ and the scanner drive 11 to drive the positional sensor unit, 1 to scan the lead terminals in the opposite direction. In the opposite directional scanning, the positioner sensor unit 1 sequentially scans the lead terminal to detect the projective positions $x_n 3$, $x_n 1$, - - - $x_1 3$ and $x_1 1$ and the memory 4 sequentially stores the values of the projective positions $x_n 3$, $x_n 1$, - - - $x_1 3$ and $x_1 1$.

Once having received positional data of the positional sensor unit 1 in detecting the upper and lower edges $E_U$ and $E_D$ of the lead terminals, the microcomputer 3 computes by the mathematical equations (5) and (6) to compute the height H of each lead terminal and pitches I of adjacent lead terminals and displays computation results on the display 5.

When obtaining only the pitches P, the positional sensor unit 1 which holds a normal position to the IC 50 and scans the lead terminals in the direction of the X-axis.

In the above embodiment of the present invention, the rotational positioner 10 inclines the positional sensor unit 1 from the normal to the upper surface of the IC 50 through the angle $\theta$. An alternative embodiment of the present invention may employ a second pair of a laser beam transmitter and a laser beam receiver producing EL beam path having the angle $\theta$ from a normal to the upper surface of the IC 50. An alternative embodiment of the present invention may employ a second positional sensor unit producing a beam path having the angle $\theta$.

In the present invention, detecting each of the upper edge of each of the lead terminals and the lower edge of the side of the lead terminal opposite to the side having this upper edge at different angles can easily provide a possible relief in the lead terminal. The employment of the light-penetrating positional sensor unit of the laser beam transmitter 15 and the laser beam receiver 16 has errors in measuring reliefs and pitches of the lead terminals smaller than an employment of a light-reflecting positional sensor unit.

What is claimed is:

1. A method of measuring a state of an IC lead frame comprising the steps of:

projecting a first image of an upper edge of a lead terminal of the IC lead frame on a reference surface; projecting a second image of said upper edge on the reference surface, the second image of said upper edge being projected at an angle different from the angle at which said first image is projected;

projecting a first image of a lower edge of the lead terminal on the reference surface; projecting a second image of said lower edge on said reference surface, the second image of said lower edge being projected at an angle different from the angle at which said first image of said lower edge is projected;

detecting said images; and computing the state of the lead terminal from the detection of said images.

2. The method of measuring a state of an IC lead frame as recited in claim 1, wherein said step of computing includes the step of:

measuring a relief of the lead terminal for the IC lead frame from said images and said angles.

3. The method of measuring a state of an IC lead frame as recited in claim 1, wherein said step of computing includes the step of:

measuring pitches of lead terminals of the IC lead frame from either of said first and second images.

4. The method of measuring a state of an IC lead frame as recited in claim 1, wherein each of said first images aligns with a straight line passing through an upper edge and an opposite lower edge of a corresponding lead terminal of the IC lead frame.

5. The method of measuring a state of an IC lead frame as recited in claim 1, wherein opposite side edges of an intermediate part of the lead terminal having a predetermined distance from the front edge of the lead terminal provide said upper and lower edges of the lead terminal said images of which are to be detected.

* * * * *